United States Patent
Somasundaram et al.

(10) Patent No.: US 7,908,533 B2
(45) Date of Patent: Mar. 15, 2011

(54) PROCESSOR TO JTAG TEST ACCESS PORT INTERFACE

(75) Inventors: Senthil Somasundaram, Sunnyvale, CA (US); Jun Qian, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 220 days.

(21) Appl. No.: 12/203,109

(22) Filed: Sep. 2, 2008

(65) Prior Publication Data

US 2010/0058130 A1    Mar. 4, 2010

(51) Int. Cl.
*G01R 31/28* (2006.01)
(52) U.S. Cl. .......................... 714/727; 714/729
(58) Field of Classification Search .............. 712/227; 717/128; 714/38, 45, 724, 727, 733, 729
See application file for complete search history.

(56) References Cited

U.S. PATENT DOCUMENTS

| | | | | |
|---|---|---|---|---|
| 6,041,406 A | * | 3/2000 | Mann | 712/227 |
| 6,142,683 A | * | 11/2000 | Madduri | 717/128 |
| 6,145,100 A | * | 11/2000 | Madduri | 714/45 |
| 6,154,856 A | * | 11/2000 | Madduri et al. | 714/27 |
| 6,185,732 B1 | * | 2/2001 | Mann et al. | 717/128 |
| 6,189,140 B1 | * | 2/2001 | Madduri | 717/128 |
| 6,314,530 B1 | * | 11/2001 | Mann | 714/38 |

OTHER PUBLICATIONS

Oshana, Rob "Introduction to JTAG", Embedded.com, Embedded Systems Design, (Oct. 29, 2002), 4 pgs.
Test Technology Standards, Committee Of The IEEE Comuters., "IEEE Standard Test Access Port and", IEEE Std 1149.-1990, Document provided by IHS Licensee=Global Electronic Production/1111125001, User=CINDYP, Oct. 24, 2003, 12:50:37 MDT, (Jun. 17, 1993), 139 pgs.
Sun Microelectronics, "JTAG Boundary Scan Basics", Introduction to JTAG Boundary ,Scan White Paper, Jan. 1997, pp. 1-8.
Whetsel, Lee "A Proposed Standard Test Bus Boundry Scan Architecture", CH2643-5/88/0000/0330$01.00 1988 IEEE, Texas Instruments Incorporated Test Automation Department,(1989), pp. 330-333.

* cited by examiner

*Primary Examiner* — David Ton

(57) ABSTRACT

Method and apparatus for operating for operating an Institute of Electrical and Electronics Engineers (IEEE) Standard 1149.1 compliant Joint Test Action Group (JTAG) Test Access Port (TAP) controller are disclosed. An example apparatus includes write logic that is configured to operationally interface with a TAP controller and a processor. The write logic is further configured to receive, from the processor, data for initializing the apparatus and operating the TAP controller, convert at least a portion of the data from a parallel format to a serial format and communicate the converted data to the TAP controller.

19 Claims, 7 Drawing Sheets

CONFIGURATION REGISTER 400

| BITS | FUNCTION | R/W | DEFAULT |
|---|---|---|---|
| [31:21] | RESERVED | RW | 11'b0 |
| [20] | CONFIG_DONE | RW | 1'b0 |
| [19] | DEBUG_ENABLE | RW | 1'b0 |
| [18] | TDO_EN_TYPE | RW | 1'b0 |
| [17] | DISABLE_TDO_EN_TYPE | RW | 1'b0 |
| [16:1] | TCK_DIVIDER_VALUE | RW | 16'd4 |
| [0] | CPU2JTAG_RESET | RW | 1'b0 |

FIG. 4

CONTROL REGISTER 500

| BITS | FUNCTION | R/W | DEFAULT |
|---|---|---|---|
| [11] | ABORT | RW | 1'b0 |
| [10] | AUTO_PROG_DISABLE | RW | 1'b0 |
| [9:5] | SERIAL_PROG_BITS_VALID | RW | 5'b11111 |
| [4:1] | GO_TO_TAP_STATE | RW | 4'b0000 |
| [0] | EXECUTE | RW | 1'b0 |

FIG. 5

LENGTH REGISTER 600

| BITS | FUNCTION | R/W | DEFAULT |
|---|---|---|---|
| [31:0] | Instruction_Data Register length | RW | 32'd0 |

FIG. 6

VALUE REGISTER 700

| BITS | FUNCTION | R/W | DEFAULT |
|---|---|---|---|
| [31:0] | Instruction_Data Register value | RW | 32'd0 |

FIG. 7

TEST RESET REGISTER    800

| BITS | FUNCTION | R/W | DEFAULT |
|---|---|---|---|
| [31:0] | JTAG_TRST_L register | RW | 32'hffff_ffff |

FIG. 8

TEST MODE SELECT REGISTER    900

| BITS | FUNCTION | R/W | DEFAULT |
|---|---|---|---|
| [31:0] | JTAG_TMS register | RW | 32'hffff_ffff |

FIG. 9

STATUS REGISTER    1000

| BITS | FUNCTION | R/W | DEFAULT |
|---|---|---|---|
| [7:4] | RESERVED | R | 4'b0000 |
| [3] | DEBUG_DATA_VALID | R | 1'b0 |
| [2] | Done with abort indication | R | 1'b0 |
| [1] | Done without abort indication (normal completion) | R | 1'b0 |
| [0] | Busy indication | R | 1'b0 |

FIG. 10

TEST DATA OUTPUT REGISTER    1100

| BITS | FUNCTION | R/W | DEFAULT |
|---|---|---|---|
| [63:58] | JTAG TDO valid bits | R | 6'b000000 |
| [57:0] | JTAG TDO register | R | 58'h0000_0000 |

FIG. 11

| JTAG INSTRUCTION | TAP STATE | TCK CYCLES |
|---|---|---|
| ASSERT_TRST | 4'b0100 | 32 |
| DEASSERT_TRST | 4'b0101 | 32 |
| TEST_LOGIC_RESET | 4'b0000 | 6 |
| TEST_LOGIC_RESET_32 | 4'b1000 | 32 |
| RUN_TEST_IDLE | 4'b0001 | 1 |
| RUN_TEST_IDLE_32 | 4'b1001 | 32 |
| RUN_TEST_IDLE_SPL | 4'b1010 | N |
| LOAD_IR | 4'b0010 | 1 TO N |
| LOAD_DR | 4'b0011 | 1 TO N |

PROCESSOR TO JTAG TEST ACCESS PORT INTERFACE

TECHNICAL FIELD

The present disclosure relates generally to interfaces for operating a test access port (TAP) controller.

BACKGROUND

As the complexity of integrated circuits continues to increase, new approaches for testing such integrated circuits are constantly being developed. These approaches include the design and use of circuitry that is specifically designed for testing the integrated circuit in which it is implemented. One such approach that is widely used is the use of an Institute for Electrical and Electronics Engineers (IEEE) 1149.1 Standard Joint Test Action Group (JTAG) Test Access Port (TAP) controller. Such TAP controllers are implemented using a sixteen state, state machine to execute various instructions related to verifying functionality of a circuit in which the TAP controller is implemented.

At the component level, a TAP port is operated using five device pins (e.g., accessible at the packages pins). A TAP controller's pins include a Test Data In (TDI) pin, a Test Mode Select (TMS) pin, a Test Clock (TCK) pin, a Test Data Output (TDO) pin and a Test Reset (TRST) pin. During functional testing at the component level, accessing the TAP controller pins is easily accomplished. However, once a component is mounted, for example, on a system board, accessing the TAP controller requires that the TAP controller pins be routed on the board so that a user wishing to use the TAP port has access to them. Such routing may increase system board complexity and cost. Further, having board level access to a given component's TAP controller is of essentially no value to end consumers. Therefore, the cost of providing board level access to TAP controllers of devices on a system board is not value added for end consumers. Furthermore, operating a TAP controller in such a fashion (e.g., in a system board) typically requires complicated serial programming, including monitoring the state of a TAP controller that is being accessed at the system board level.

BRIEF DESCRIPTION OF THE DRAWINGS

FIG. 4 is a table illustrating an example embodiment of a TAP controller interface configuration register.

FIG. 5 is a table illustrating an example embodiment of a TAP controller interface control register.

FIG. 6 is a table illustrating an example embodiment of a TAP controller interface length register.

FIG. 7 is a table illustrating an example embodiment of a TAP controller interface value register.

FIG. 8 is a table illustrating an example embodiment of a TAP controller interface TAP reset register.

FIG. 9 is a table illustrating an example embodiment of a TAP controller interface TAP Mode Select register.

FIG. 10 is a table illustrating an example embodiment of a TAP controller interface status register.

FIG. 11 is a table illustrating an example embodiment of a TAP controller interface output register.

DESCRIPTION OF EXAMPLE EMBODIMENTS

Overview

Apparatus and/or methods for operating a TAP controller, substantially as shown in and/or described in connection with at least one of the figures, as set forth more completely in the claims.

An example apparatus may include write logic that operationally interfaces with an Institute of Electrical and Electronics Engineers (IEEE) Standard 1149.1 compliant Joint Test Action Group (JTAG) Test Access Port (TAP) controller and a processor. The write logic may be configured to receive, from the processor, data for initializing the apparatus and operating the TAP controller. The write logic may be further configured to convert at least a portion of the data from a parallel format to a serial format and communicate the converted data to the TAP controller. The apparatus may still further include recovery logic that operationally interfaces with the TAP controller and the write logic. The recovery logic may be configured to monitor a state of the TAP controller and place the TAP controller in a correct state for executing an instruction included in the data received from the processor. The apparatus may still further include read logic that operationally interfaces with the TAP controller, the recovery logic and the processor. The read logic may be configured to receive, from the recovery logic, and provide, to the processor, status information regarding operation of the TAP controller. The read logic may be further configured to receive serial output data from the TAP controller, convert the serial output data to parallel output data, and communicate the parallel output data to the processor.

EXAMPLE EMBODIMENTS

Figure 1:
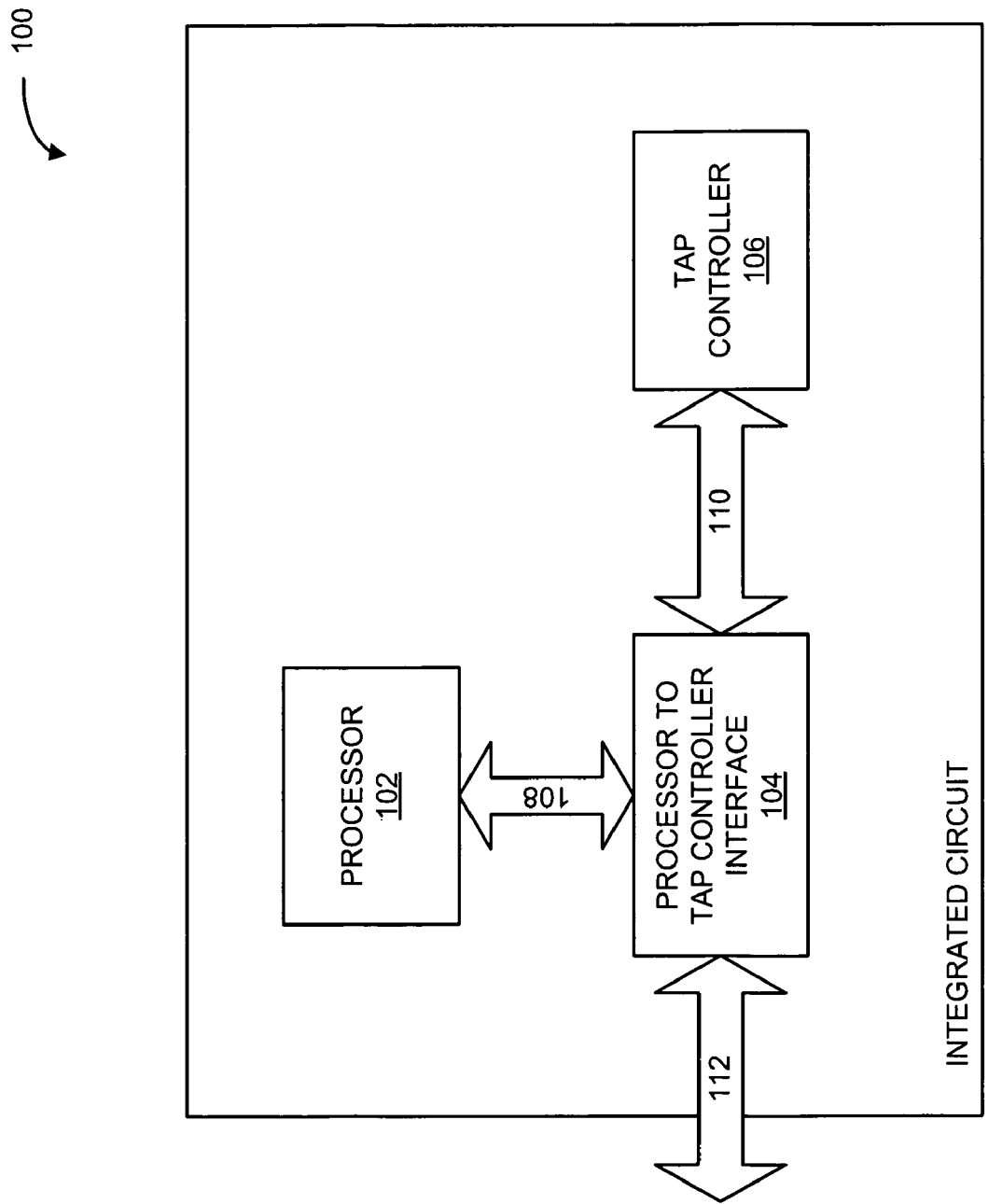
FIG. 1 is a block diagram illustrating an example embodiment of a test access port (TAP) controller interface implemented in an integrated circuit.

FIG. 1 is a block diagram illustrating an example embodiment of an integrated circuit 100 that includes a processor to TAP controller interface 104. In such an embodiment, a user may supply configuration and instruction information to the TAP controller interface 104 using a processor 102, where the configuration and instruction information is communicated over a parallel interface 108, such as a processor data bus. The TAP controller interface 104 may then use the configuration and instruction information to execute one more TAP controller instructions using a TAP controller 106.

In the integrated circuit 100, the processor 102 may communicate parallel data (e.g., up to 32 bits at a time for a 32 bit processor) to the TAP controller interface 104. The TAP controller interface 104 may monitor and communicate with the TAP controller 106 via a serial interface 110. The TAP controller interface 104 may convert, at least a portion of, the parallel data to serial data. That converted (serial) data may then be communicated to the TAP controller 106 over a serial interface 110. The TAP controller 106 may then use the serial data to execute the one or more TAP instructions included in the instruction information.

The integrated circuit 100 may also include a standard TAP controller interface 112 (i.e., as defined in IEEE 1149.1) that is coupled with external signal pins of the integrated circuit 100. As is discussed in further detail below, the integrated circuit 100 may include integration logic that is used to select between operating the TAP controller using parallel data received from the processor 102 or using serial data received from the standard TAP controller interface 112.

It is noted that the integrated circuit 100 may take any number of forms. For instance, the integrated circuit 100 may be an Application Specific Integrated Circuit (ASIC) or may be any general purpose integrated circuit. Further, the processor 102 may be a general purpose processor. Alternatively, as another example, the processor 102 may be an application specific processor, such as a network processor, for example.

Figure 2:
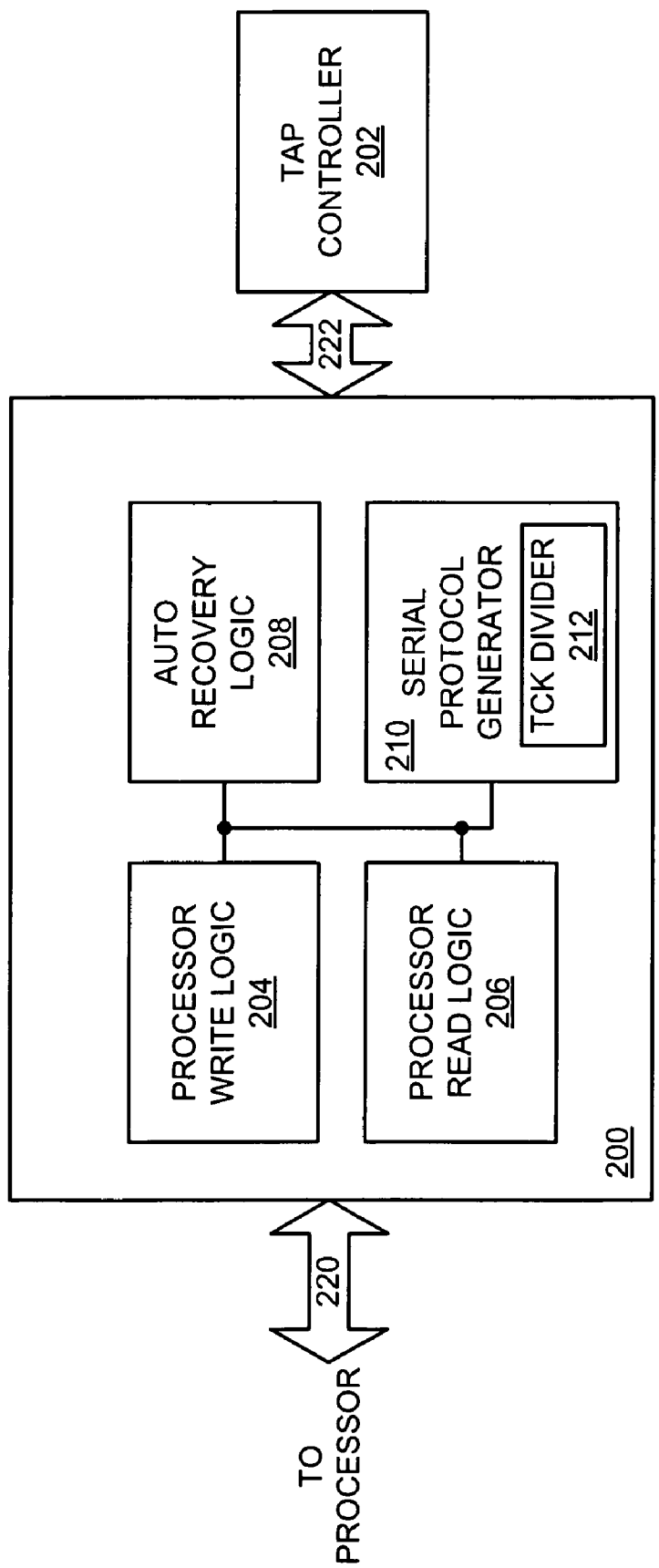
FIG. 2 is a block diagram illustrating an example embodiment of a TAP controller interface.

FIG. 2 is a block diagram illustrating an example embodiment of a TAP controller interface 200. In like fashion as discussed above, the TAP controller interface 200 may communicate with a processor over a parallel interface 220. Further, in like fashion as discussed above, the TAP controller interface 200 may convert parallel data received from the processor to serial data. This serial data may then be communicated to a TAP controller 202 via a serial interface 222 to execute one or more TAP instructions included in the parallel data.

The TAP controller interface 200 may include processor write logic 204 that is operationally coupled with the processor and the TAP controller 202. Such an operational coupling may be direct, or may be accomplished via one or more other circuits, for example. In an example embodiment, the write logic 204 may be configured to receive, from the processor, data for initializing and/or configuring the TAP controller interface 200 and for operating the TAP controller 202 to execute one or more TAP instructions.

In order to operate the TAP controller 202, the TAP controller interface 200 may convert at least a portion of the data received from the processor from a parallel format to a serial format. Such conversion may include conversion of parallel data stored in one or more registers of the write logic 204 to serial data that is communicated over interface 222. Additionally, such conversion may also include decoding parallel data included in one or more registers of the write logic 204 to determine an instruction, or instructions to be executed by the TAP controller 202. The write logic 204 may be further configured to communicate the converted data to the TAP controller 202.

The TAP controller interface 200 may further include auto recovery logic 208 that is operationally coupled (e.g., directly or via one or more other circuits) with the TAP controller 202 and the write logic 204. In the example TAP controller interface 200 of FIG. 2, the recovery logic 208 may be configured to monitor a state of the TAP controller 202. Based on the monitoring of the TAP controller 202, the recovery logic 208 may determine if the TAP controller 202 is in an appropriate state for executing the instruction or instructions designated in the parallel data received from the processor. In the event that the TAP controller 202 is not in an appropriate (e.g., correct) state for executing a designated instruction, the recovery logic 208 may be further configured to place the TAP controller 202 in the appropriate state (e.g., by transitioning a state machine of the TAP controller) for executing the designated instruction(s) included in the data received from the processor.

As shown in FIG. 2, the TAP controller interface 200 may further include read logic 206. In an example embodiment, the read logic 206 may be operationally coupled with the TAP controller, the recovery logic 208 and the processor. In like fashion as discussed above, such operational coupling may or may not be accomplished using other circuits. In an example embodiment, the read logic 206 may be configured to receive, from the recovery logic 208, and provide, to the processor, status information regarding operation of the TAP controller 202 (e.g., status information regarding execution of a TAP controller instruction provided by the processor).

In an example embodiment, the read logic 206 may be further configured to receive serial output data from the TAP controller 202 (e.g., Test Data Output (TDO) data) and convert the serial output data to parallel output data. The read logic 206 may be still further configured to communicate the parallel output data (e.g., the converted TDO data) to the processor.

As illustrated in FIG. 2, the TAP controller interface 200, in an example embodiment, may also include a serial protocol generator 210 that is operationally coupled with the write logic 204, the TAP controller 202 and the read logic 206. In such embodiments, the serial protocol generator 210 may be configured to serially operate each input pin of the TAP controller 202 using parallel data communicated to the write logic 204 by the processor, as well as provide TDO data to the read logic 206.

For instance, the serial protocol generator 210 may use data provided to the write logic 204 to operate, over the serial interface 222, a Test Reset (TRST) input, a Test Data Input (TDI) input, a Test Mode Select (TMS) input and a Test Clock (TCLK) input of the TAP controller 202. Further, the serial protocol generator may be configured to receive serial output data from the TDO output of the TAP controller 202 via the serial interface 222 and provide the TDO output data to the read logic 206, which may then be read by the processor.

As illustrated in FIG. 2, the serial protocol generator 210 may include a TCK (clock) divider 212. The TCK divider 212, in an example embodiment, may be configured to receive a divider value from the processor (e.g., via the write logic 204) and receive a clock signal from the processor. The clock divider 212 may be further configured to divide the clock signal received from the processor using the divider value to generate a divided clock signal and to provide the divided clock signal to the TCK input of the TAP controller 202. Such approaches may allow the TAP controller 202 to be run at lower frequencies in order to prevent improper operation of the TAP controller 202 due to setup timing issues.

It will be appreciated that, in other embodiments, the TCK divider 212 may be implemented as a separate entity from the serial protocol generator 210. For instance, the TCK divider 212 may be coupled directly with the processor, rather than via the write logic 204, for example. In other embodiments, the TCK divider 212 may be implemented as part of the recovery logic 208, as another example.

Figure 3:
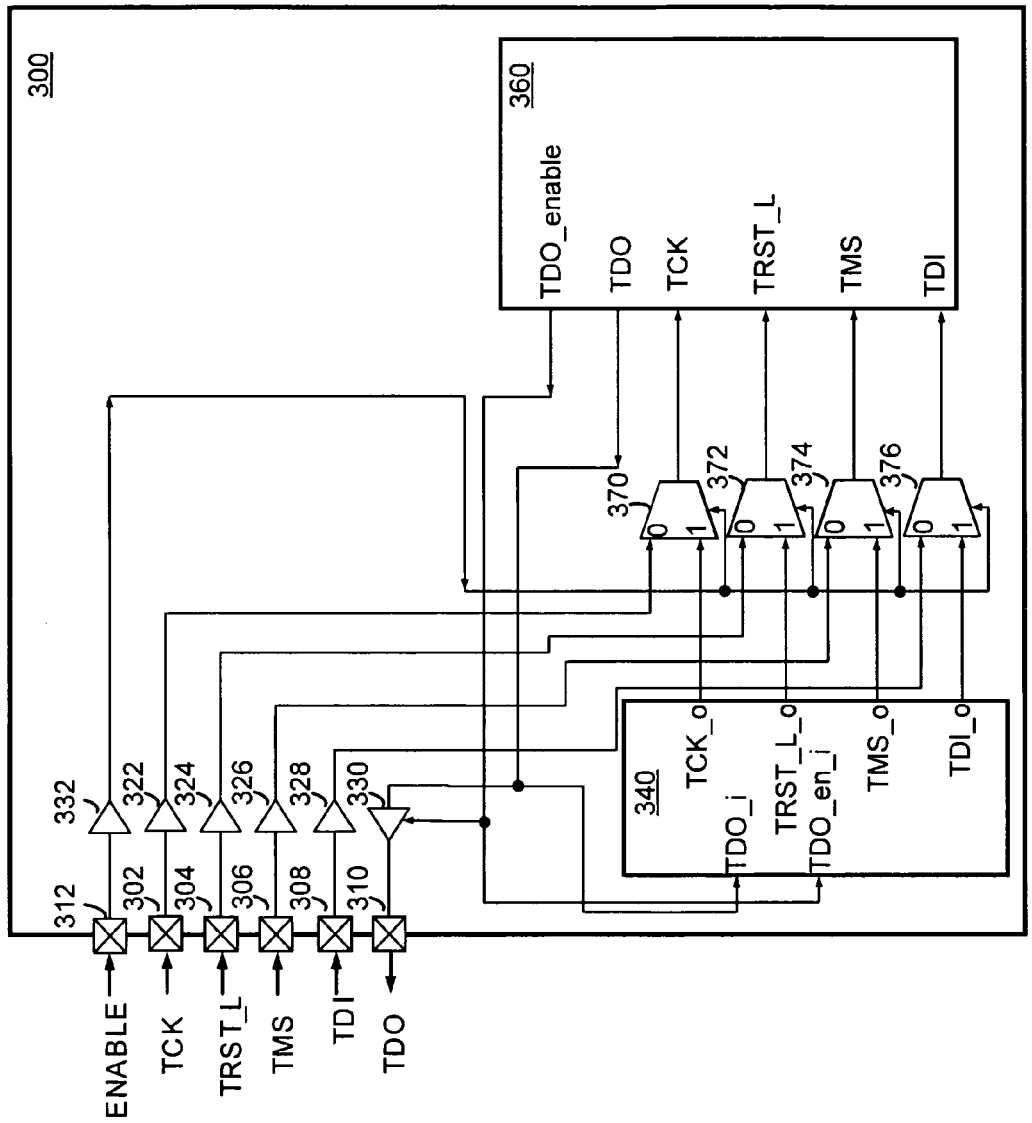
FIG. 3 is a block diagram illustrating an example embodiment of integration logic for a TAP controller interface.

FIG. 3 is a block diagram illustrating an example embodiment of an integrated circuit 300 that includes logic that may be used to integrate a TAP controller interface 340, such those illustrated in FIGS. 1 and 2, into a device including a TAP controller 360. In such embodiments, a user may select between operating the TAP controller 360 using an external, serial (e.g., traditional) TAP controller interface or, alternatively, using the TAP controller interface 340 in conjunction with a processor.

The integrated circuit 300 illustrated in FIG. 3 includes a traditional, component level TAP controller interface that includes a TCK input pin 302, a TRST_L (active low) input pin 304, a TMS input pin 306, a TDI input pin 308 and a TDO output pin 310. The integrated circuit 300 also includes an ENABLE input pin 312. In an example embodiment, the ENABLE pin 312 may be configured for use in selecting between using the traditional TAP controller serial interface to operate the TAP controller 360 or using the processor to TAP controller interface 340 to operate the TAP controller 360.

As shown in FIG. 3, each of the input pins 302-308 and 312 are coupled with corresponding input buffers, 322, 324, 326, 328 and 332. Likewise, the TDO output pin 310 is coupled with a corresponding output buffer 330.

The TDO output of the TAP controller 360 is coupled with an input terminal of the output buffer 330. Additionally, the TDO output of the TAP controller 360 may be provided as an input to the TAP controller interface 340. The TDO output signal from the TAP controller 360 may be may used by the TAP controller interface 340 to monitor a state of the TAP controller 360, such as by recovery logic of the TAP controller interface 340, for example.

A TDO_enable output of the TAP controller 360 may be coupled with an enable terminal of the output buffer 330. The TDO_enable output may further be provided to the TAP controller interface 340 as an input signal for use, for example, by recovery logic to monitor the state of the TAP controller 360.

The integrated circuit 300 further includes multiplexers (MUXs) 370, 372, 374 and 376. The MUXs 370-376 may be used to select between TAP controller inputs provided from the external (traditional) serial interface (e.g., via input buffers 322-328) or TAP controller inputs from the TAP controller interface 340. As shown in FIG. 3, the input buffer 332 that is coupled with the ENABLE input pin 312 may be coupled to a select (SEL) terminal of each MUX. A signal provided to the ENABLE input pin 312 may then be used to select between the external (traditional) serial interface and the TAP controller interface 340 for operating the TAP controller 360.

FIGS. 4-9 illustrate example embodiments of registers that may be included in write logic (e.g., write logic 204) of a TAP controller interface, such as the TAP controller interface 200 illustrated in FIG. 2, for example. FIG. 4 illustrates an example configuration register 400, FIG. 5 illustrates an example control register 500, FIG. 6 illustrates an example length register 600, FIG. 7 illustrates an example value register 700, FIG. 8 illustrates an example TRST register 800 and FIG. 9 illustrates an example TMS register 900. It will be appreciated that these registers are given by way of example and any appropriate arrangement of such registers or any number of other approaches for receiving configuration and instruction information may be used.

The example configuration register 400 illustrated by the diagram in FIG 4 may be used, e.g., by a user, to provide configuration information for a TAP controller interface, such as the interface 200, for example. In an example embodiment, the configuration register may be configured to receive, from the processor (e.g., from a user), a first data bit that is configured, when logic low, to reset the TAP controller interface, including loading default values. Upon device power up, or after a reset, the first data bit may be assigned a value of '1,' which indicates that reset is not active.

The configuration register 400 may be further configured to receive a divider value (16 bits) for generating a divided clock signal from a clock signal received from the processor, such as discussed above. Upon power up, or after a reset operation, the divider value may be assigned a decimal value of '4' or a binary value of '100,' indicating that a frequency of the processor clock is to be divided by four and a clock of one-fourth the frequency of the processor clock is to be provided to the TCK input of the TAP controller.

The configuration register 400 may also be configured to receive a third data field/bit that is configured to enable or disable a Test Data Output (TDO) of the TAP controller. Upon power up, or after a reset operation, the third data bit may be assigned a value of '1' indicating that TDO_enable output of the TAP controller 360 will be ignored by TAP Controller interface 340, and TAP Controller interface 340 monitors Test Data Output (TDO) value at every TCK cycle. The configuration register 400 may be further configured to receive a fourth data field/bit that is configured to select whether the TDO operates in a logic high state or logic low state. Upon power up, or after a reset operation, the fourth data bit may be assigned a value of '0,' indicating that TDO is active low. This fourth data bit field is valid only when the third field of disabling TDO_enable output type is assigned to a value of '0'.

The configuration register 400, or any of the other registers described herein, may also include a field that may be used for debugging purposes. Additionally, the configuration register 400 (or any other register) may include a field, or fields that are reserved for future use.

The configuration register 400 may be still further configured to receive a sixth data field/bit that indicates that configuration of the TAP controller interface is complete (e.g., a user has provided configuration information to the TAP controller interface and indicated that configuration is complete). Upon power up, or after a reset operation, this sixth data bit may assigned a value of '0,' indicating that configuration is not complete. When a value of "1" is written to the sixth data bit, in an example embodiment, any configuration values written to the TAP controller interface and/or default values (e.g., if user values for one or more fields have not been provided) may be latched into the TAP controller interface.

FIG. 5 is a diagram that illustrates an example control register 500. The control register 500, in an example embodiment, may be configured to receive, from the processor, a value (4 bits) indicating an instruction to be executed by the TAP controller. For instance, the value indicating the instruction may be a value that indicates a state of the TAP controller state machine that corresponds with the instruction to be executed. Upon power up, or after a reset operation, the value indicating the instruction to be executed may be assigned a value of '0,' which may correspond with a TEST LOGIC RESET state of the TAP controller state machine.

The control register 500 may be further configured to receive a fifth data bit that is configured to abort a currently executing instruction in the TAP controller. Upon power up, or after a reset, the fifth data bit may be given a value of '0,' which may indicate that a currently executing instruction should not be aborted.

The control register 500 may be still further configured to receive a first data field/bit that is configured to initiate execution of the instruction to be executed by the TAP controller, where the execution may be done in conjunction with recovery logic, for example. Upon power up, or after a reset, the first data bit may be given a value of '0,' which may indicate that there is not an instruction ready to be executed.

The control register 500 may also be configured to receive a fourth data field/bit that is configured to indicate that the TAP controller interface shall serially operate each input of the TAP controller (e.g., using a serial protocol generator) using parallel data communicated to the write logic from the processor. Upon power up, or after a reset, the fourth data bit may be given a value of '0,' which may indicate that the TAP controller interface shall operate using the auto recovery logic and parallel data provided, from a processor, to write logic of the TAP controller interface.

The control register 500 may also be configured to receive a third data filed (e.g., a 5-bit value) that indicates a number of valid serial bits for use by the serial protocol generator when the fourth data bit is given a value of '1' by a user, for example. When the fourth data bit is low (e.g., the serial protocol generator is not being used), the value indicating a number of valid serial bits is not used. Upon power up, or after a reset, the value indicating a number of valid serial bits may be given a decimal value of '31', indicating that thirty-two bits of serial data are valid in data that is provided to the write logic by the processor.

FIG. 6 is a diagram that illustrates a length register 600 that is configured to receive, from the processor, a value (32 bits) indicating a number of TCK cycles corresponding with an instruction to be executed by the TAP controller, such as in the control register. When the TAP controller interface is operating using the serial protocol generator, the length register 600 may be used receive a sequence of values for the TCK input of a TAP controller. Upon power up, or after a reset, the length register may be given a value of '0.'

FIG. 7 is a diagram that illustrates a value register 700 that is configured to receive, from the processor, a value (32 bits) indicating a data value associated with the instruction to be executed by the TAP controller. When the TAP controller interface (e.g., such as the interface 200 shown in FIG. 2) is operating using the serial protocol generator, the value register 700 may be used to receive a sequence of values for the TDI input of a TAP controller. Upon power up, or after a reset, the value register may be given a value of '0.'

FIG. 8 is a diagram that illustrates a Test Reset (TRST) register 800 that is configured to receive, from the processor, a sequence of TRST values for the TAP controller when operating a TAP controller interface, such as the interface 200, using a serial protocol generator, as previously discussed. In an example embodiment, when the TAP controller interface is not operated using the serial protocol generator, the TRST register 800 may not be used. Upon power up, or after a reset, the TRST register 800 may be given a hex value of 'ffff_ffff.'

FIG. 9 is a diagram that illustrates a Test Mode Select (TMS) register 900 that is configured to receive, from the processor, a sequence of TMS values for the TAP controller when operating a TAP controller interface, such as the interface 200, using a serial protocol generator, such as described above. In an example embodiment, when the TAP controller interface is not operated using the serial protocol generator, the TMS register 900 may not be used. Upon power up, or after a reset, the TMS register 900 may be given a hex value of 'ffff_ffff.'

FIGS. 10 and 11 illustrate example embodiments of registers that may be included in read logic (e.g., read logic 206) of a TAP controller interface, such as the TAP controller interface 200 illustrated in FIG. 2, for example. FIG. 10 illustrates an example status register 1000 and FIG. 11 illustrates an example output register 1100. It will be appreciated that these registers are given by way of example and any appropriate arrangement of such registers or any number of other approaches for receiving and/or providing status and output data may be used.

FIG. 10 is a diagram illustrating a status register 1000, where the status register 1000 is configured to receive a data bit indicating that the TAP controller is busy executing an instruction. This data bit may be termed a BUSY signal and may be asserted, for example, by recovery logic included in a TAP controller interface. The BUSY indication may be asserted while instruction information is being communicated from write logic to the TAP controller and/or while the TAP controller is executing an instruction. In other embodiments, a BUSY indication may be provided by recovery logic when a first part of an instruction is being loaded to a TAP controller. In such a situation, when the BUSY indication is removed, this would indicate to a processor (or user) that the TAP controller and the TAP controller interface are ready to receive the next part of, or the rest of, the instruction to be executed. Such an approach may be used when the instruction length exceeds an associated processor's word size. For instance, such an approach may be used to execute a 64 bit TAP instruction when using a 32 bit processor is used to communicate with a TAP controller interface. Upon power up, or after a reset, the data bit indicating that the TAP controller is busy may be given a value of '0,' which may indicate that the TAP controller is not busy loading or executing an instruction.

The status register 1000 may further include a data bit indicating that the TAP controller has successfully completed execution of an instruction. This data bit may be termed a DONE indication and may be asserted by recovery logic when it is determined that an executing instruction has completed execution. Upon power up, or after a reset, the data bit indicating that the TAP controller has successfully completed execution of an instruction may be given a value of '0,' which may indicate that the TAP controller has not just completed execution of an instruction.

The status register 1000 may still further include a data bit indicating that the TAP controller has successfully aborted execution of an instruction. This indication may be termed a DONE WITH ABORT indication. The DONE WITH ABORT indication may be provided in response to an ABORT being requested by a user, such as using an ABORT data bit in control register (e.g., the control register 500 in FIG. 5). Upon power up, or after a reset, the data bit indicating that the TAP controller has successfully aborted execution of an instruction may be given a value of '0,' which may indicate that the TAP controller has not just aborted execution of an instruction.

As was discussed above with respect to the configuration register 400, the status register 1000 may include a field that is used for debugging purpose, as well as a field that is reserved for future use. In other embodiments, these fields may be eliminated or may be present in other registers, for example.

FIG. 11 is a diagram illustrating a TDO output register 1100. The output register 1100 may be configured to receive serial output data from a Test Data Output (TDO) of the TAP controller. The output register 1100 may also be configured to receive a value (6 bits) indicating a number of valid TDO bits in the received TDO data. As may be seen in FIG. 11, the output register is 64 bits. Accordingly, in a 32 bit processor, two read transactions may be used by the processor to obtain the information in the output register. If more than 64 bits are available as output data, additional read transactions may be used to obtain the output data. Upon power up, or after a reset, the output register may be given a value of '0.'

Figure 12:
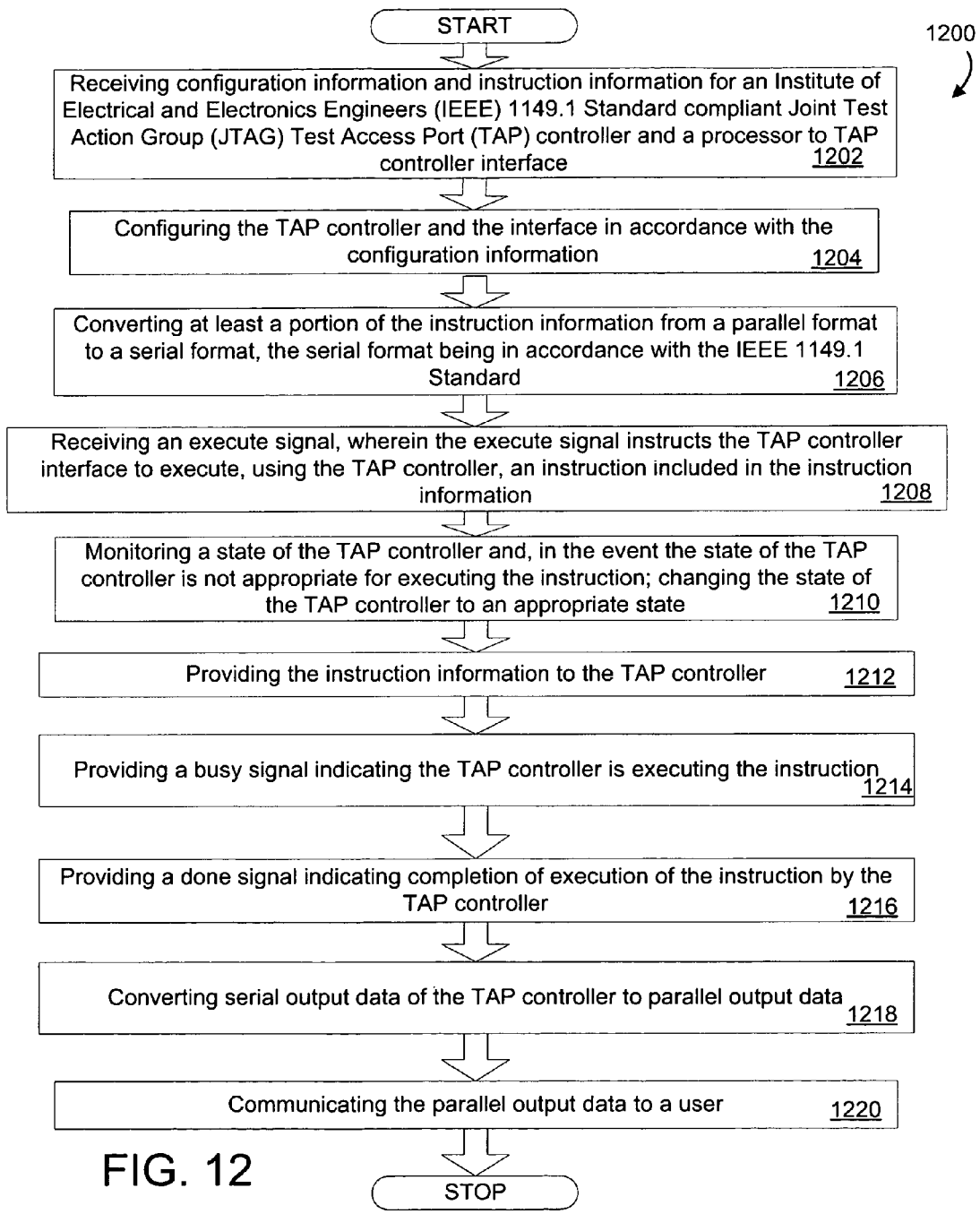
FIG. 12 is a flowchart illustrating an example embodiment of a method for operating a TAP controller using a TAP controller interface, such as the TAP controller interface illustrated in FIG. 2.

FIG. 12 is a flowchart illustrating an example embodiment of a method 1200 for operating a TAP controller using a TAP controller interface. For instance, the method 1200 may be implemented using the TAP controller interface illustrated in FIG. 2. Alternatively, the method 1200 may be implemented using any appropriate TAP controller interface.

The method 1200, at block 1202, may include receiving configuration information and instruction information for an Institute of Electrical and Electronics Engineers (IEEE) 1149.1 Standard compliant Joint Test Action Group (JTAG) Test Access Port (TAP) controller and a processor to TAP controller interface. For example, a configuration register, such as the configuration register discussed above with respect to FIG. 4, may receive such configuration information.

Such configuration information may be written using a single write operation or using multiple write operations. For instance, in an example embodiment, a first write operation may provide configuration information for resetting the TAP controller and the TAP controller interface, while a second write operation may be used to provide configuration information for executing an instruction after completion of a reset sequence.

Likewise, the instruction information may be provided in one or more write operations. For example, if a 64-bit TAP instruction is to be executed by a TAP controller using a TAP controller interface in conjunction with a 32-bit processor, the instruction information may be provided to the TAP controller (via the TAP controller interface) using two write operations.

At block 1204, the method 1200 may include configuring the TAP controller and the TAP controller interface in accordance with the configuration information. For example, the TAP controller and the TAP controller interface may be reset and then appropriately configured for executing an instruction based on the configuration information.

At block 1206, the method 1200 may further include converting at least a portion of the instruction information from a parallel format to a serial format, where the serial format is in accordance with the IEEE 1149.1 Standard. For instance, parallel data indicating a desired TAP state for executing an instruction may be proved to a control register, such as the control register discussed above with respect to FIG. 5. The TAP controller interface may convert the parallel data indicating the desired TAP controller state to a serial data sequence corresponding with the desired TAP controller state (e.g., in compliance with IEEE 1149.1). Furthermore, parallel instruction length information and/or parallel instruction data information may also be converted to IEEE 1149.1 compliant serial data. Such conversion from parallel data to IEEE 1149.1 compliant serial data may be performed, for example, using processor write logic, such as was described above with respect to FIG. 2.

At block 1208, the method 1200 may include receiving an execute signal (e.g., in a control register). The execute signal may instruct the TAP controller interface to load and/or execute, using the TAP controller, an instruction (or portion of an instruction) included in the instruction information. For instance, instructions that exceed a word size of a processor that is used to communicate instruction information to a TAP controller interface may be provided in multiple operations. Accordingly, in such situations, the operations of blocks 1202, 1206 and 1208 may be repeated in order to provide the instruction information for instructions that exceed an associated processor's word length.

At block 1210, the method 1200 may include monitoring a state of the TAP controller. In the event the state of the TAP controller is not appropriate for executing the instruction; block 1210 may also include changing the state of the TAP controller to an appropriate state, e.g., by cycling sequentially through TAP controller states. The operations of block 1210 may be implemented, for example, by auto-recovery logic, such as the auto-recovery logic 208 discussed above with respect to FIG. 2.

At block 1212, the method 1200 may further include providing the instruction information to the TAP controller. As indicated above, the instruction information may be provided to the TAP controller in a single operation or multiple operations, depending on the size of the instruction as compared to the word size of an associated processer that is used to communicate the instruction information to the TAP controller interface.

The method 1200 may also include, at block 1214, providing a busy signal indicating the TAP controller is executing an instruction or is loading instruction information. After the instruction is loaded and executed, the method 1200 may include, at block 1216, providing a Done signal indicating completion of execution of the instruction by the TAP controller. For instance, a Done signal may be provided to a status register included in the TAP controller interface, such as the status register discussed above with respect to FIG. 10.

Once the instruction is done executing, the method 1200 may further include, at block 1218, converting serial output data of the TAP controller to IEEE 1149.1 compliant parallel output data. At block 1220, the parallel output data may then be communicated to a user, e.g., via a processor. As with the instruction information, communicating the parallel output data may be done in one or more operations, depending on a number of parallel output data bits as compared to a word size of an associated processor. The parallel output data may provided via a Test Data Output register, such as the Test Data Output register discussed above with respect to FIG. 11.

Figures 13, 14:
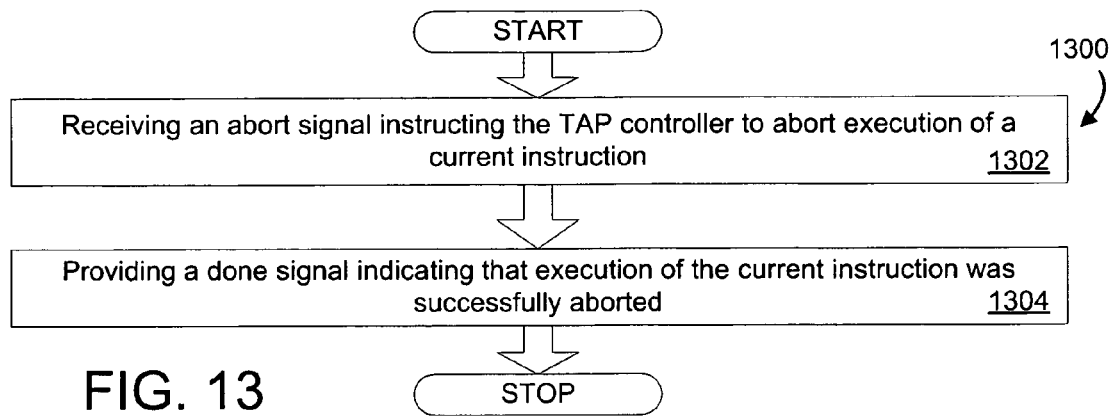
FIG. 13 is a flowchart illustrating another example embodiment of a method for operation a TAP controller using a TAP controller interface, such as the TAP controller interface illustrated in FIG. 2.
FIG. 14 is a table illustrating an example set of instructions that may be executed using a TAP controller interface, such as illustrated in FIG. 2.

FIG. 13 is a flowchart illustrating an example method 1300 for aborting an instruction that is being processed by a TAP controller under the direction of a TAP controller interface, such as the TAP controller interface 200 illustrated in FIG. 2. In the START operation of the method 1300, instruction and configuration information may be provided to a TAP controller interface and the TAP controller interface may instruct a TAP controller to execute an instruction included in the instruction information, such as in the fashion discussed above with respect to FIG. 12, for example.

For instance, the TAP controller interface may receive instruction information that indicates two million cycles of a RUN_TEST_IDLE instruction are to be executed by the TAP controller. The TAP controller interface may then convert parallel data to IEEE 1149.1 compliant serial data, provide the instruction information to the TAP controller and instruct the TAP controller to begin execution of the two million cycles of the instruction.

During execution of the two million cycles of the RUN_TEST_IDLE instruction, a user may wish to stop execution of that instruction and direct the TAP controller to execute a different instruction. The method 1300 may be implemented to achieve such a result.

For instance, the method 1300 may include, at block 1302, receiving an abort signal (e.g., from a user) that instructs the TAP controller interface to abort execution of the current instruction. For instance, in the TAP controller interface 200 of FIG. 2, the abort signal may be provided to a control register, such as the control register described above with respect to FIG. 5. The auto-recovery logic 208 may then halt execution of the two millions cycles of RUN_TEST_IDLE and place the TAP controller 202 in a state for executing a new instruction. This may be accomplished using any appropriate technique, such as, for example, by the auto-recovery logic 208 resetting the TAP controller 202.

At block 1304, the method 1300 may further include providing a done signal indicating that the execution of the current instruction has been successfully aborted. For instance, a Done_With_Abort signal may be provided to a status register included in the TAP controller interface, such as the status register discussed above with respect to FIG. 9.

FIG. 14 is a table 1400 illustrating a list of TAP controller instructions that may be supported by a TAP controller interface, such as the TAP controller interfaces illustrated in FIGS. 1 and 2. The table 1400 includes the JTAG (TAP) instruction name, the four-bit TAP state (that may be written to the control register 500 discussed above, for example) corresponding with each instruction and a number of TCK cycles corresponding with each instruction.

The instructions in table 1400 include ASSERT_TRST, which has a four-bit TAP state of '0100' and executes for 32 TCK cycles. The instructions in table 1400 also include DEASSERT_TRST, which has a four-bit TAP state of '0101' and executes for 32 TCK cycles. The instructions in table 1400 further include TEST_LOGIC_RESET and TEST_LOGIC_RESET_32, which have respective four-bit TAP states of '0000' and '1000' and execute for 6 TCK cycles and 32 TCK cycles, respectively.

The instructions in table 1400 still further include RUN_TEST_IDLE, RUN_TEST_IDLE_32, RUN_TEST_IDLE_SPL, which have respective four-bit TAP states of '0001', '1001' and '1010' and execute for 1 TCK cycle, 32 TCK cycles and N TCK cycles, respectively. N TCK cycles, for an example embodiment, may indicate that the corresponding instruction would execute for the number of TCK cycles indicated in a length register, e.g., such as the length register 600 described above. The instructions in table 1400 also include LOAD_IR (Load Instruction Register) and LOAD_DR (Load Data Register), which have respective four-bit TAP states of '0010' and '0011' and execute for N TCK cycles each, e.g., the number of TCK cycles indicated in a length register. Of course, other instructions may be supported by a TAP controller interface, or in other embodiments instructions that are supported may be eliminated.

Implementations of the various techniques described herein may be implemented in digital electronic circuitry, or in computer hardware, firmware, software, or in combinations of them. Implementations may implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art.

What is claimed is:

1. An apparatus comprising:
  write logic configured to:
    operationally interface with an Institute of Electrical and Electronics Engineers (IEEE) Standard 1149.1 compliant Joint Test Action Group (JTAG) Test Access Port (TAP) controller;
    operationally interface with a processor;
    receive, from the processor, data for initializing the apparatus and operating the TAP controller;
    convert at least a portion of the data from a parallel format to a serial format; and
    communicate the converted data to the TAP controller; and
  recovery logic operationally coupled with the write logic, the recovery logic being configured to:
    operationally interface with the TAP controller so as to:
      monitor a state of the TAP controller; and
      place the TAP controller in a correct state for executing an instruction included in the data received from the processor.

2. The apparatus of claim 1, wherein the instruction is communicated to the TAP controller in a single transaction.

3. The apparatus of claim 1, wherein:
  the instruction is communicated to the TAP controller in two or more transactions;

the TAP controller is put into a hold state between transactions; and the recovery logic indicates when the apparatus and TAP controller are ready for each transaction.

4. The apparatus of claim 1, wherein the write logic includes a plurality of write logic registers configured to receive the data for initializing the apparatus and operating the TAP controller, the plurality of write logic registers including:

a configuration register, the configuration register being configured to receive, from the processor:
 a first data bit configured, when logic low, to reset the apparatus, including loading default values;
 a second data bit configured to enable or disable a Test Data Output (TDO) of the TAP controller;
 a third data bit configured to select whether the TDO operates in a logic high state or logic low state;
 a divider value for generating a divided clock signal from a clock signal received from the processor; and
 a fourth data bit indicating that configuration of the apparatus is complete;

a control register, the control register being configured to receive, from the processor:
 a value indicating an instruction to be executed by the TAP controller;
 a fifth data bit configured to abort a currently executing instruction in the TAP controller; and
 a sixth data bit configured to initiate execution of the instruction to be executed by the TAP controller, the execution being done in conjunction with the recovery logic;

a length register configured to receive, from the processor, a value indicating a number of Test Clock (TCK) cycles corresponding with the instruction to be executed by the TAP controller; and a value register configured to receive, from the processor, a data value associated with the instruction to be executed by the TAP controller.

5. The apparatus of claim 4, wherein the plurality of write logic registers further include:

a TAP Test Reset (TRST) register configured to receive, from the processor, a sequence of TRST values for the TAP controller; and a TAP Test Mode Select (TMS) register configured to receive, from the processor, a sequence of TMS values for the TAP controller, and wherein:
 the length register is further configured to receive, from the processor, a sequence of TCK values for the TAP controller;
 the value register is further configured to receive, from the processor, a sequence of Test Data Input (TDI) values for the TAP controller; and
 the apparatus is configured to operate the TAP controller using the sequences of values in the TRST register, the TMS register, the length register and the value register.

6. The apparatus of claim 4, wherein the control register is further configured to receive a seventh data bit configured to indicate that the apparatus serially operate each input of the TAP controller using parallel data communicated to the write logic from the processor.

7. The apparatus of claim 1, further comprising read logic operationally coupled with the recovery logic, the read logic being configured to:

operationally interface with the TAP controller and the processor so as to:
 receive, from the recovery logic, and provide, to the processor, status information regarding operation of the TAP controller;

receive serial output data from the TAP controller;
convert the serial output data to parallel output data; and
communicate the parallel output data to the processor.

8. The apparatus of claim 7, wherein the read logic includes:

a status register, the status register being configured to receive:
 a data bit indicating the TAP controller is busy executing an instruction;
 a data bit indicating that the TAP controller successfully completed execution of an instruction; and
 a data bit indicating that the TAP controller successfully aborted execution of an instruction; and an output register, the output register being configured to receive:
 serial output data from a Test Data Output (TDO) of the TAP controller; and
 a value indicating a number of valid TDO bits received.

9. The apparatus of claim 8, wherein the signal indicating that the TAP controller successfully completed execution of an instruction and the signal indicating that the TAP controller successfully aborted execution of an instruction both indicate the TAP controller is available to execute a next instruction.

10. The apparatus of claim 1, further comprising a serial protocol generator operationally coupled with the write logic, the serial protocol generator being configured to operationally interface with the TAP controller and the processor so as to serially operate each input pin of the TAP controller using parallel data communicated to the write logic by the processor.

11. The apparatus of claim 1, further comprising a clock divider, the clock divider being configured to:
 receive a divider value from the processor;
 receive a clock signal from the processor;
 divide the clock signal using the divider value to generate a divided clock signal; and
 provide the divided clock signal to a Test Clock Input (TCK) of the TAP controller.

12. The apparatus of claim 1, wherein the apparatus is configured to execute, in conjunction with the TAP controller and the processor, TAP instructions including ASSERT_TRST, DEASSERT_TRST, TEST_LOGIC_RESET, TEST_LOGIC_RESET_32, RUN_TEST_IDLE, RUN_TEST_IDLE_32, RUN_TEST_IDLE_SPL, LOAD_IR and LOAD_DR.

13. A method comprising:

receiving configuration information and instruction information for an Institute of Electrical and Electronics Engineers (IEEE) 1149.1 Standard compliant Joint Test Action Group (JTAG) Test Access Port (TAP) controller and a processor to TAP controller interface;

configuring the TAP controller and the interface in accordance with the configuration information;

converting at least a portion of the instruction information from a parallel format to a serial format, the serial format being in accordance with the IEEE 1149.1 Standard;

receiving an execute signal, wherein the execute signal instructs the TAP controller interface to execute, using the TAP controller, an instruction included in the instruction information;

monitoring a state of the TAP controller and, in the event the state of the TAP controller is not appropriate for executing the instruction; changing the state of the TAP controller to an appropriate state;

providing the instruction information to the TAP controller;

providing a busy signal indicating the TAP controller is executing the instruction;

providing a done signal indicating completion of execution of the instruction by the TAP controller;

converting serial output data of the TAP controller to parallel output data; and communicating the parallel output data to a user.

14. The method of claim 13, wherein the configuration data, the instruction data and the execute signal are provided by the user.

15. The method of claim 13, further comprising receiving an abort signal provided by the user, the abort signal being received after providing the busy signal but prior to providing the done signal, wherein providing the done signal indicates the instruction was successfully aborted.

16. The method of claim 13, wherein providing the instruction information is accomplished in a single transaction.

17. The method of claim 13, wherein communicating the parallel output data to the user is accomplished in two or more transactions.

18. The method of claim 13, wherein receiving the instruction information includes receiving a four-bit code indicating a desired state of the TAP controller for executing the instruction.

19. An apparatus comprising:

write logic configured to operationally interface with a processor and a test access port (TAP) controller, the write logic including:

a configuration register configured to receive, from the processor, information for initializing and configuring the apparatus;

a control register configured to receive, from the processor, instruction information and control information for executing an instruction with the TAP controller;

a length register configured to receive, from the processor, a value indicating a number of Test Clock (TCK) cycles corresponding with the instruction to be executed by the TAP controller; and a value register configured to receive, from the processor, a data value associated with the instruction to be executed by the TAP controller;

recovery logic operationally coupled with the write logic, the recovery logic being configured to:

operationally interface with the TAP controller so as to:

monitor a state of the TAP controller;

place the TAP controller in a correct state for executing an instruction included in the data received from the processor; and control execution of the instruction by the TAP controller; and read logic operationally coupled with the recovery logic, the read logic being configured to operationally interface with the TAP controller and the processor, the read logic including:

a status register, the status register being configured to receive, status information regarding execution of the instruction; and an output register, the output register being configured to receive output data from the TAP controller.

\* \* \* \* \*